(12) United States Patent
Park et al.

(10) Patent No.: US 9,064,833 B2
(45) Date of Patent: Jun. 23, 2015

(54) ORGANIC LIGHT EMITTING DIODE DISPLAY

(71) Applicant: Samsung Display Co., Ltd., Yongin, Gyeonggi-Do (KR)

(72) Inventors: Kyung-Hoon Park, Yongin (KR); Jong-Hyun Park, Yongin (KR); Seong-Kweon Heo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/093,270

(22) Filed: Nov. 29, 2013

(65) Prior Publication Data

US 2014/0145171 A1 May 29, 2014

(30) Foreign Application Priority Data

Nov. 29, 2012 (KR) .................. 10-2012-0137356

(51) Int. Cl.
*H01L 29/08* (2006.01)
*H01L 35/24* (2006.01)
*H01L 51/00* (2006.01)
*H01L 27/32* (2006.01)

(52) U.S. Cl.
CPC ................. *H01L 27/3276* (2013.01)

(58) Field of Classification Search
CPC ...................................... H01L 27/00
USPC ........................................... 257/40
See application file for complete search history.

(56) References Cited

U.S. PATENT DOCUMENTS

| 2005/0179379 A1* | 8/2005 | Kim .............................. 313/512 |
| 2013/0257839 A1* | 10/2013 | Hyeon et al. .................. 345/212 |
| 2014/0097420 A1* | 4/2014 | Lee et al. ........................ 257/40 |

FOREIGN PATENT DOCUMENTS

| JP | 2010117549 A | 5/2010 |
| KR | 100671638 B1 | 1/2007 |
| KR | 100897157 B1 | 5/2009 |
| KR | 1020090119599 A | 11/2009 |
| KR | 1020120031367 A | 4/2012 |
| KR | 1020120108900 A | 10/2012 |
| KR | 1020130041575 A | 4/2013 |
| KR | 1020130128283 A | 11/2013 |

* cited by examiner

*Primary Examiner* — Telly Green
(74) *Attorney, Agent, or Firm* — Robert E. Bushnell, Esq.

(57) ABSTRACT

Disclosed is an organic light emitting diode display including: a pixel unit including an organic light emitting diode for displaying an image; and a periphery surrounding the pixel unit. The periphery includes a gate common voltage line formed on the substrate and receiving a common voltage from an external circuit, an interlayer insulating layer covering the gate common voltage line and including a common voltage contact hole for exposing a part of the gate common voltage line, a data common voltage line formed on the interlayer insulating layer and contacting the gate common voltage line through the common voltage contact hole, and a plurality of protrusions provided in the common voltage contact hole and formed on the substrate.

11 Claims, 8 Drawing Sheets

ORGANIC LIGHT EMITTING DIODE DISPLAY

RELATED APPLICATIONS

This application claims priority to and the benefit of Korean Patent Application No. 10-2012-0137356 filed in the Korean Intellectual Property Office on Nov. 29, 2012, the entire contents of which are incorporated herein by reference.

BACKGROUND

1. Field

The described technology relates generally to an organic light emitting diode (OLED) display.

2. Description of the Related Art

An organic light emitting diode display includes two electrodes and an organic emission layer interposed therebetween, electrons injected from a cathode that is one electrode and holes injected from an anode that is another electrode are bonded to each other in the organic emission layer to form an exciton, and light is emitted while the exciton discharges energy.

Each pixel of the organic light emitting diode display includes a switching thin film transistor, a driving thin film transistor, a capacitor, and an organic light emitting diode. A driving voltage ELVDD is supplied from a driving voltage line to the driving thin film transistor and the capacitor, and the driving thin film transistor serves to control the current flowing to the organic light emitting diode through the driving voltage line. A common voltage line supplies a common voltage ELVSS to the cathode and forms a potential difference between a pixel electrode as an anode and a common electrode, thereby causing a current between the pixel electrode and the common electrode.

The common voltage ELVSS is transmitted to the common electrode formed on barrier ribs by continuous contact among a gate common voltage contact unit including gate lines, a data common voltage contact unit including data lines, and the common electrode, which are formed in a peripheral region.

However, because of a thickness of the barrier rib, a developer is not sufficiently vaporized so a lifting phenomenon may be generated at a border of a contact hole formed in the barrier rib.

Regarding the lifting phenomenon, a common electrode provided on the barrier rib is passed through the contact hole to deteriorate adherence with a bottom metal film and generate heat.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode (OLED) display with reduced heat generation.

An exemplary embodiment provides an organic light emitting diode (OLED) display including: a pixel unit formed on a substrate and including an organic light emitting diode for displaying an image; and a periphery surrounding the pixel unit, wherein the periphery includes a gate common voltage line formed on the substrate and receiving a common voltage from an external circuit, an interlayer insulating layer for covering the gate common voltage line and including a common voltage contact hole for exposing a part of the gate common voltage line, a data common voltage line formed on the interlayer insulating layer and contacting the gate common voltage line through the common voltage contact hole, a barrier rib covering the data common voltage line and including a common voltage opening exposing a part of the data common voltage line, a common electrode formed on the barrier rib and contacting the data common voltage line through the common voltage opening, and a plurality of protrusions provided in the common voltage contact hole and formed on the substrate.

The organic light emitting diode includes a first electrode, an organic emission layer provided on the first electrode, and a second electrode provided on the organic emission layer, and the common electrode is integrally formed with the second electrode.

The second electrode is formed on the pixel unit.

The pixel unit includes a thin film transistor for connecting the first electrode to a drain electrode of the thin film transistor.

The protrusion is formed with a material that includes a material of a semiconductor of the thin film transistor.

The organic light emitting diode display further includes a buffer layer formed on the substrate, wherein the protrusion includes a first protrusion made of the same material as the buffer layer, and a second protrusion provided on the first protrusion and made of the same material as the semiconductor.

The organic light emitting diode display further includes a buffer layer formed on the substrate, wherein the protrusion is made of the same material as the buffer layer.

The buffer layer includes at least one of silicon nitride and silicon oxide.

The substrate includes a recess portion provided between neighboring protrusions.

The pixel unit includes: a gate line formed on the substrate and transmitting a scan signal; a data line and a driving voltage line crossing the gate line in an insulated manner and transmitting a data signal and a driving voltage, respectively; a switching thin film transistor connected to the gate line and the data line; a driving thin film transistor connected to the switching thin film transistor and the driving voltage line; a first electrode connected to the driving thin film transistor; an organic emission layer formed on the first electrode; and a second electrode formed on the organic light emitting diode, wherein the gate common voltage line is formed on the same layer as the gate line, and the data common voltage line is formed on the same layer as the data line.

A contact area of the common electrode and the common voltage line is increased by the protrusion of the organic light emitting device according to the exemplary embodiment so contact resistance is reduced. Therefore, generation of heat caused by an increase of resistance according to the lifting phenomenon of the barrier rib can be reduced.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, the size and thickness of each component shown in the drawings are arbitrarily shown for better understanding and ease of description, but the present invention is not limited thereto.

In the drawings, the thickness of layers, films, panels, regions, etc., are exaggerated for clarity. For understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. The word "on" means positioned on or below the object portion, but does not essentially mean positioned on the upper side of the object portion based on a gravity direction.

Figure 1:
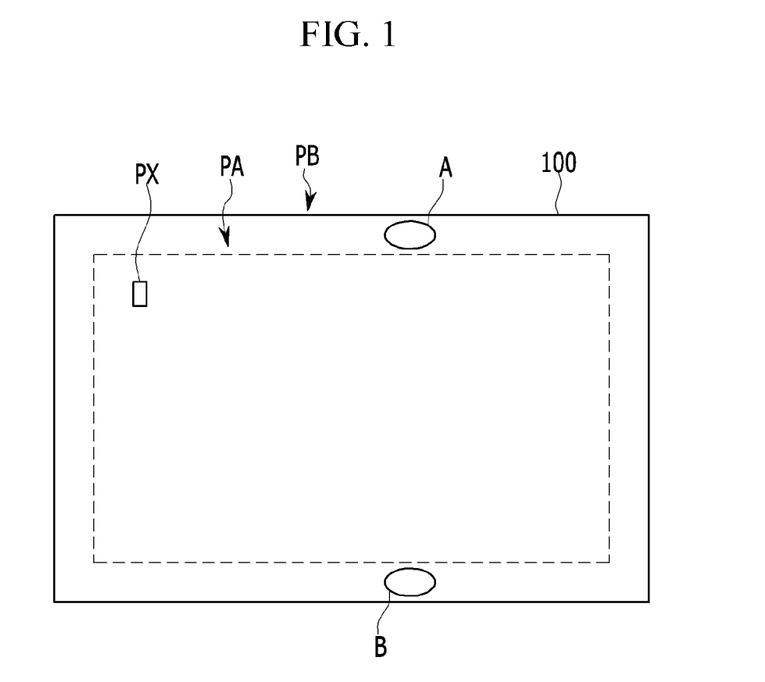
FIG. 1 shows a top plan view of an organic light emitting diode (OLED) display according to an exemplary embodiment.

FIG. 1 shows a top plan view of an organic light emitting diode (OLED) display according to an exemplary embodiment.

As shown in FIG. 1, the organic light emitting diode (OLED) display includes a substrate 100, a pixel unit (PA) formed on the substrate 100 and including a plurality of pixels (PX) configured by an organic light emitting diode (LD), and a periphery (PB) surrounding the pixel unit (PA).

The pixel (PX) will now be described with reference to FIG. 2.

Figure 2:
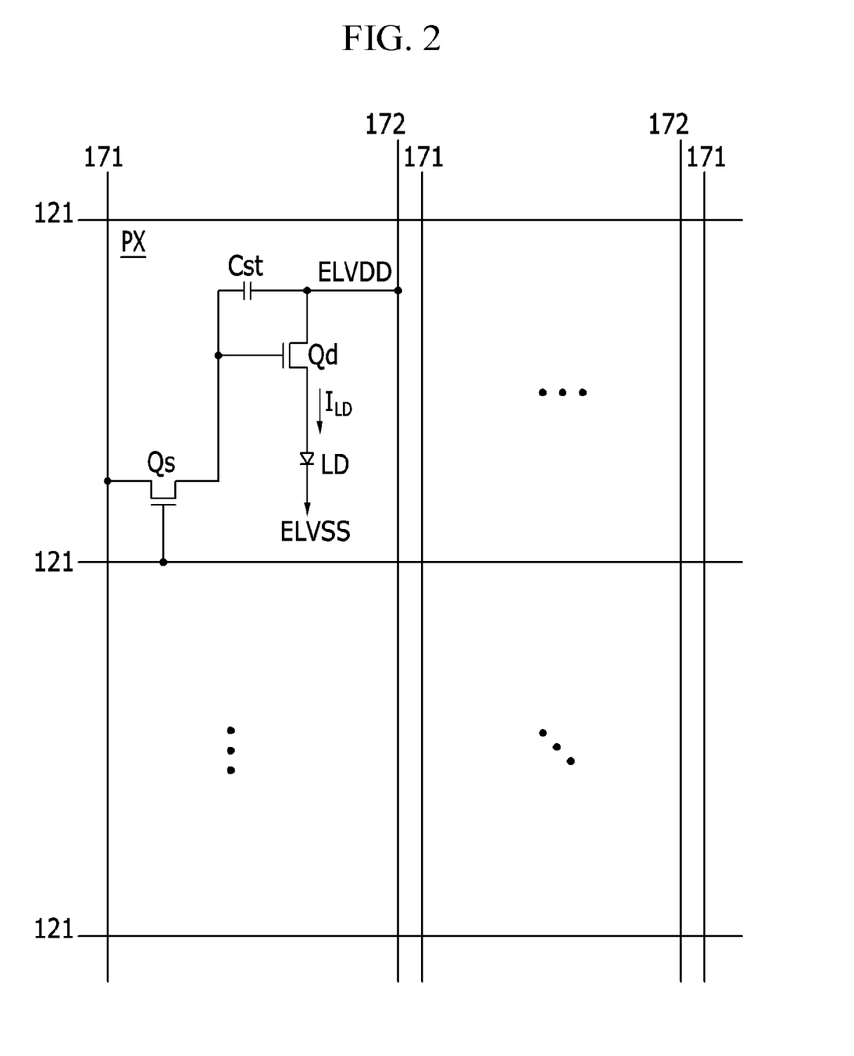
FIG. 2 shows an equivalent circuit for a pixel of an organic light emitting diode (OLED) display according to an exemplary embodiment.

FIG. 2 shows an equivalent circuit for a pixel of an organic light emitting diode (OLED) display according to an exemplary embodiment.

Figure 3:
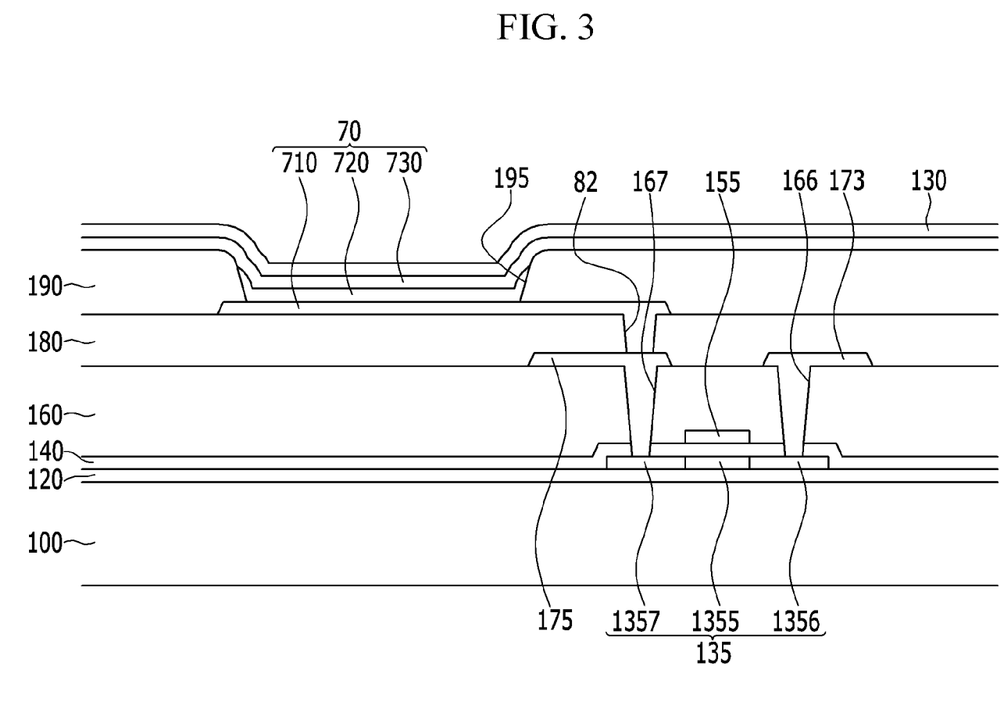
FIG. 3 shows a cross-sectional view of a pixel of an organic light emitting diode (OLED) display according to an exemplary embodiment.

A detailed configuration of the pixel of the display panel is shown in FIG. 2 and FIG. 3, and the exemplary embodiment is not restricted to the configuration shown in FIG. 2 and FIG. 3. The wire and the organic light emitting diode may be formed in various structures within the range in which those skilled in the art can readily make modifications. For example, the accompanying drawing shows a two-transistors-one-capacitor (2Tr-1Cap) structured active matrix (AM) type of display device in which one pixel includes two thin film transistors (TFTs) and one capacitor, and the embodiment is not limited thereto. Therefore, the display device does not restrict numbers of thin film transistors, capacitors, and wires. In addition, the pixel represents the minimum unit for displaying an image, and the display device uses a plurality of pixels to display the image.

As shown in FIG. 2, the display device includes a plurality of signal lines 121, 171, and 172 and a plurality of pixels (PX) connected thereto and arranged in a matrix form.

The signal line includes a plurality of gate lines 121 for transmitting a gate signal (or a scan signal), a plurality of data lines 171 for transmitting a data signal, and a plurality of driving voltage lines 172 for transmitting a driving voltage (ELVDD). The gate lines 121 are provided in a row direction and are substantially parallel with each other, and parts of the data lines 171 and the driving voltage lines 172 in a vertical direction are provided in a column direction and are substantially parallel with each other.

The pixel (PX) includes a switching thin film transistor (Qs), a driving thin film transistor (Qd), a storage capacitor (Cst), and an organic light emitting diode (OLED) (LD).

The switching thin film transistor (Qs) includes a control terminal, an input terminal, and an output terminal, and the control terminal is connected to the gate line 121, the input terminal is connected to the data line 171, and the output terminal is connected to the driving thin film transistor (Qd). The switching thin film transistor (Qs) responds to the scan signal applied to the gate line 121 to transmit the data signal applied to the data line 171 to the driving thin film transistor (Qd).

The driving thin film transistor (Qd) includes a control terminal, an input terminal, and an output terminal, and the control terminal is connected to the switching thin film transistor (Qs), the input terminal is connected to the driving voltage line 172, and the output terminal is connected to the organic light emitting diode (LD). The driving thin film transistor (Qd) outputs an output current (ILD) that is variable according to a voltage between the control terminal and the output terminal.

The capacitor (Cst) is connected between the control terminal of the driving thin film transistor (Qd) and the input terminal. The capacitor (Cst) charges the data signal applied to the control terminal of the driving thin film transistor (Qd) and maintains it when the switching thin film transistor (Qs) is turned off.

The organic light emitting diode (LD) includes an anode connected to the output terminal of the driving thin film transistor (Qd) and a cathode connected to a common voltage (ELVSS). The organic light emitting diode (LD) changes intensity and emits light depending on the output current (ILD) of the driving thin film transistor (Qd) to thus display the image.

An inter-layer structure of an organic light emitting diode (OLED) display according to an exemplary embodiment will now be described with reference to FIG. 2 and FIG. 3.

FIG. 3 shows a cross-sectional view of a pixel of an organic light emitting diode (OLED) display according to an exemplary embodiment.

The cross-sectional view of FIG. 3 shows a thin film transistor connected to an organic light emitting diode.

As shown in FIG. 2 and FIG. 3, the organic light emitting diode (OLED) display includes a substrate 100, and a buffer layer 120 is formed on the substrate 100.

The substrate 100 can be a polymer substrate made of a polymer material, or a glass substrate.

The buffer layer 120 can be formed with a single film of silicon nitride (SiNx) or a plurality of multilayers that are generated by stacking silicon nitride (SiNx) and silicon oxide (SiO$_2$). The buffer layer 120 prevents permeation of undesired components such as impurity or moisture, and smoothes its surface.

A semiconductor 135 of polysilicon is formed on the buffer layer 120.

The semiconductor 135 includes a channel region 1355, and a source region 1356 and a drain region 1357 that are formed on both sides of the channel region 1355. The channel region 1355 of the semiconductor 135 is polysilicon to which an impurity is not doped, that is, an intrinsic semiconductor. The source region 1356 and the drain region 1357 of the semiconductor 135 are polysilicon to which a conductive impurity is doped, that is, an impurity semiconductor.

The source region 1356 and the drain region 1357 can be one of a p-type impurity and an n-type impurity.

A gate insulating layer 140 is formed on the semiconductor 135. The gate insulating layer 140 can be formed with a single layer of tetra ethyl ortho silicate (TEOS), silicon oxide (SiO$_2$), or silicon nitride (SiNx), or a plurality of multilayers that are formed by stacking silicon oxide (SiO$_2$) and silicon nitride (SiNx).

A gate electrode 155 is formed on the gate insulating layer 140, and the gate electrode 155 overlaps the channel region 1355.

The gate electrode 155 can be formed with a single layer or multilayers of a low-resistance material such as Al, Ti, Mo, Cu, Ni, or an alloy thereof, or a high-corrosion material.

A first interlayer insulating layer 160 is formed on the gate electrode 155.

In a like manner of the gate insulating layer 140, the first interlayer insulating layer 160 can be formed with a single layer of tetra ethyl ortho silicate (TEOS), silicon oxide (SiO$_2$), or silicon nitride (SiNx), or a plurality of multilayers that are formed by stacking silicon oxide (SiO$_2$) and silicon nitride (SiNx).

The first interlayer insulating layer 160 and the gate insulating layer 140 include a source contact hole 166 for exposing the source region 1356 and a drain contact hole 167 for exposing the drain region 1357.

A source electrode 173 and a drain electrode 175 are formed on the first interlayer insulating layer 160.

The source electrode 173 and the drain electrode 175 are respectively connected to the source region 1356 and the drain region 1357 through the contact holes 166 and 167.

The drain electrode 175 can be formed with a single layer or multilayers of a low-resistance material such as Al, Ti, Mo, Cu, Ni, or an alloy thereof, or a high-corrosion material. For example, the drain electrode 175 can be triple layers of Ti/Cu/Ti, Ti/Ag/Ti, or Mo/Al/Mo.

A second interlayer insulating layer 180 is formed on the drain electrode 175.

In a like manner of the first interlayer insulating layer, the second interlayer insulating layer 180 can be formed with a single layer of tetra ethyl ortho silicate (TEOS), silicon oxide (SiO$_2$), or silicon nitride (SiNx), or a plurality of multilayers that are formed by stacking silicon oxide (SiO$_2$) and silicon nitride (SiNx). The second interlayer insulating layer 180 can also be formed with a low dielectric constant organic material.

A contact hole 82 for exposing the drain electrode 175 is formed in the second interlayer insulating layer 180.

A first electrode 710 is formed on the second interlayer insulating layer 180. The first electrode 710 can be the anode of the organic light emitting diode shown in FIG. 2. An interlayer insulating layer is formed between the first electrode 710 and the drain electrode 175, and the first electrode 710 can be formed on the same layer as the drain electrode 175 and can be integrally formed with the drain electrode 175.

A barrier rib 190 is formed on the first electrode 710.

The barrier rib 190 has an opening 195 for exposing the first electrode 710. The barrier rib 190 includes a resin of a polyacrylate or a polyimide and a silica-based inorganic material.

An organic emission layer 720 is formed in the opening 195 of the barrier rib 190.

The organic emission layer 720 is formed to be multiple layers including at least one of an emission layer, a hole injection layer (HIL), a hole transport layer (HTL), an electron transport layer (ETL), and an electron injection layer (EIL).

When the organic emission layer 720 includes all of them, the hole injection layer (HIL) is provided on the first electrode 710, and the anode, the hole transport layer (HTL), the emission layer, the electron transport layer (ETL), and the electron injection layer (EIL) are sequentially stacked thereon.

A second electrode 730 is formed on the barrier rib 190 and the organic emission layer 720.

The second electrode 730 becomes the common electrode, which is the cathode of the organic light emitting diode. Therefore, the first electrode 710, the organic emission layer 720, and the second electrode 730 configure an organic light emitting diode 70.

The organic light emitting diode (OLED) display can be a front display type, a rear display type, or a both-side display type according to a direction in which the organic light emitting diode 70 emits light.

In the case of the front display type, the first electrode 710 is formed to be a reflective layer and the second electrode 730 is formed to be a semi-reflective layer or a transmissive layer. In the case of the rear display type, the first electrode 710 is formed to be a semi-transmissive layer and the second electrode 730 is formed to be a reflective layer. In the case of the both-side display type, the first electrode 710 and the second electrode 730 are formed to be transparent layers or semi-transmissive layer.

The reflective layer and the semi-transmissive layer are made of at least one metal of magnesium (Mg), silver (Ag), gold (Au), calcium (Ca), lithium (Li), chromium (Cr), and aluminum (Al), or an alloy thereof. The reflective layer and the semi-transmissive layer are determined by thickness, and the semi-transmissive layer can be formed to be less than 200 nm thick. Optical transmittance is increased when the thickness is reduced, but when it is too thin, resistance is increased.

The transparent layer is made of indium tin oxide (ITO), indium zinc oxide (IZO), zinc oxide (ZnO), or indium oxide (In$_2$O$_3$).

An encapsulation layer 130 is formed on the second electrode 730. The encapsulation layer 130 can be formed by alternately stacking at least one organic layer and at least one inorganic layer. There may be multiple inorganic layers or organic layers.

The organic layer is formed of a polymer, and desirably it may be a single layer or a deposition layer including one of polyethylene terephthalate, a polyimide, a polycarbonate, an epoxy, polyethylene, and a polyacrylate. Further desirably, the organic layer can be formed with a polyacrylate, and in detail, it includes a polymerized monomer composition including di-acrylate monomer and tri-acrylate monomer. A mono-acrylate monomer can be included in the monomer composition. Also, a photoinitiator such as TPO can be further included in the monomer composition, but is not limited thereto.

The inorganic layer can be a single layer or a deposition layer including a metal oxide or a metal nitride. In detail, the inorganic layer can include one of SiNx, $Al_2O_3$, $SiO_2$, and $TiO_2$.

The externally exposed uppermost layer of the encapsulation layer 130 can be formed with an inorganic layer so as to prevent permeation of vapor into the organic light emitting diode.

The encapsulation layer can include at least one sandwich configuration in which at least one organic layer is inserted between at least two inorganic layers. Further, the encapsulation layer can include at least one sandwich configuration in which at least one inorganic layer is included between at least two organic layers.

The encapsulation layer can sequentially include a first inorganic layer, a first organic layer, and a second inorganic layer in order from top to bottom of the display. In addition, the encapsulation layer can sequentially include a first inorganic layer, a first organic layer, a second inorganic layer, a second organic layer, and a third inorganic layer in order from top to bottom of the display. Further, the encapsulation layer can sequentially include a first inorganic layer, a first organic layer, a second inorganic layer, a second organic layer, a third inorganic layer, a third organic layer, and a fourth inorganic layer in order from top to bottom of the display.

A metal halide layer including LiF can be included between the display unit and the first inorganic layer. The metal halide layer prevents the display unit from being damaged when the first inorganic layer is formed according to a sputtering method or a plasma deposition method.

The first organic layer is narrower than the second inorganic layer, and the second organic layer can be narrower than the third inorganic layer. Further, the first organic layer is entirely covered by the second inorganic layer, and the second organic layer can be entirely covered by the third inorganic layer.

A periphery of an organic light emitting diode (OLED) display according to an exemplary embodiment will now be described.

Figure 4:
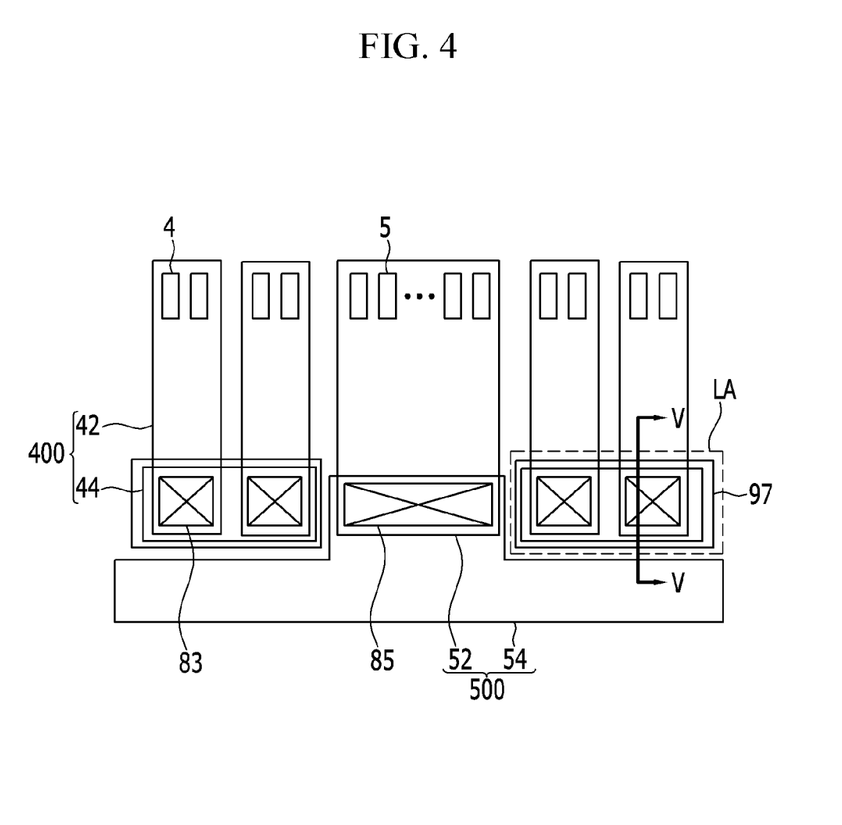
FIG. 4 shows a magnified top plan view of a side portion (A) in a periphery of FIG. 1.
Figure 5:
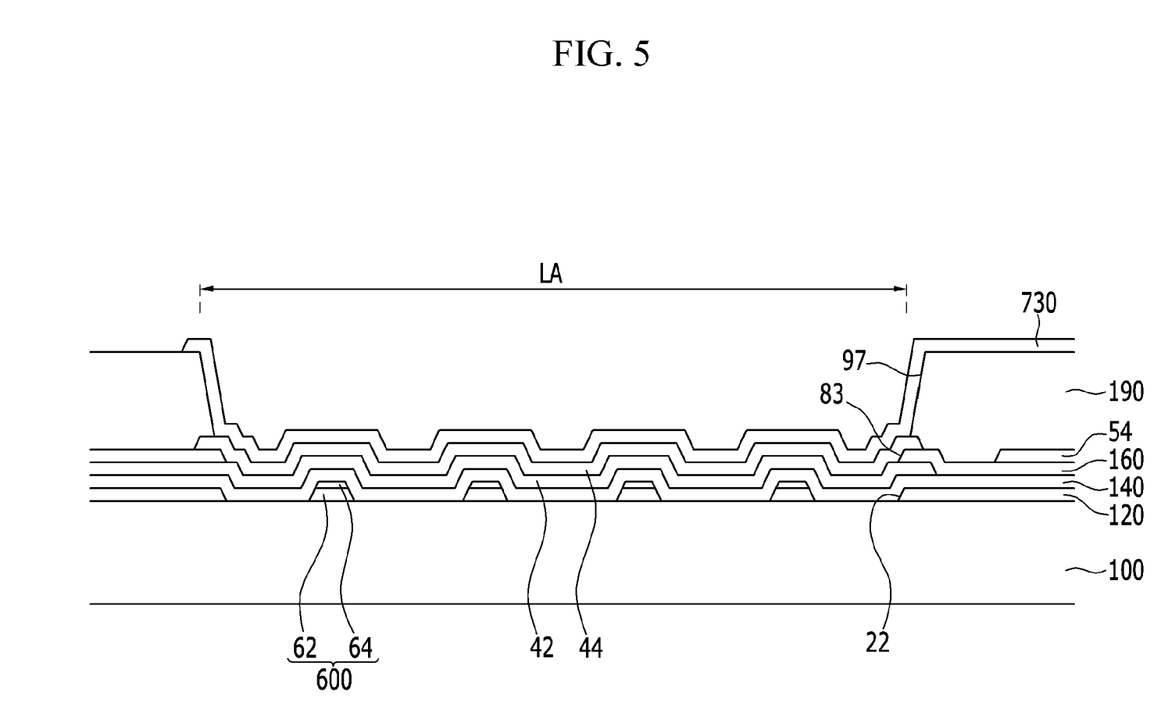
FIG. 5 shows a cross-sectional view with respect to a line V-V of FIG. 4.
Figure 6:
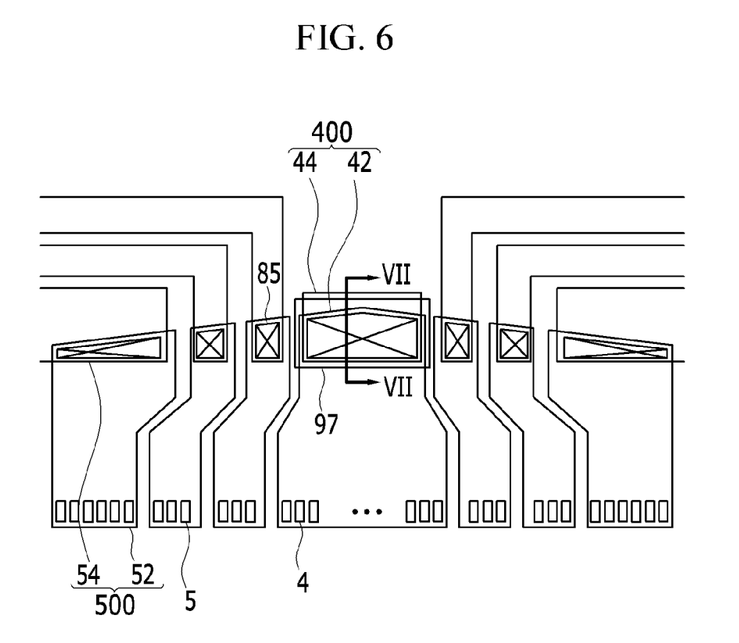
FIG. 6 shows a magnified top plan view of a side portion (B) in a periphery of FIG. 1.
Figure 7:
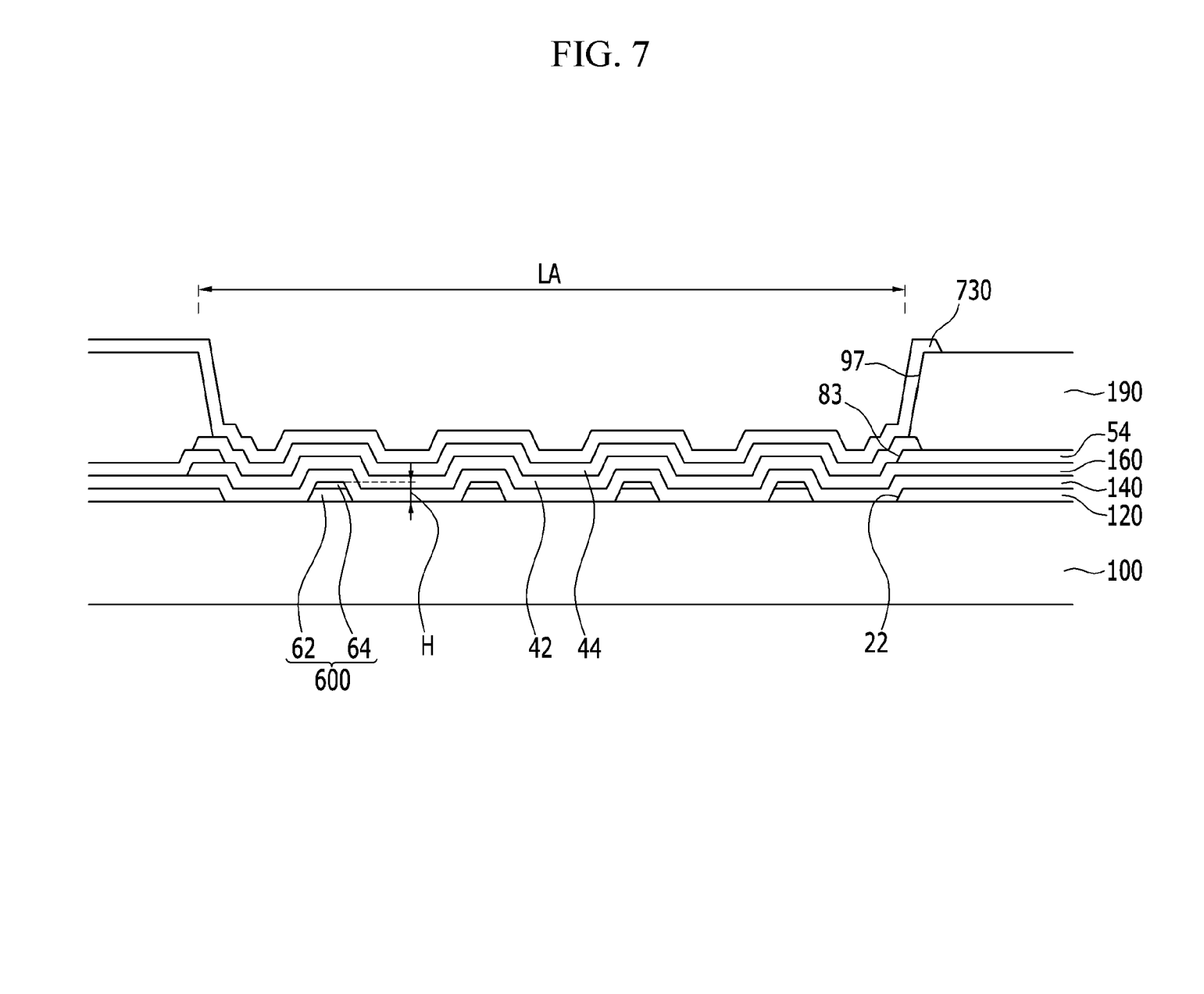
FIG. 7 shows cross-sectional view with respect to a line VII-VII of FIG. 6.

FIG. 4 shows a magnified top plan view of a side portion (A) in a periphery of FIG. 1, FIG. 5 shows a cross-sectional view with respect to a line V-V of FIG. 4, FIG. 6 shows a magnified top plan view of a side portion (B) in a periphery of FIG. 1, and FIG. 7 shows cross-sectional view with respect to a line VII-VII of FIG. 6.

As shown in FIG. 4 to FIG. 7, a buffer layer 120 is formed on the substrate 100 of the organic light emitting diode (OLED) display.

For ease of description, a portion in which a contact hole for transmitting a common voltage to a second electrode of a pixel from the outside (or an external circuit) will be called a contact area (LA). The contact area (LA) is provided on a side portion A and a side portion B of the periphery (PB), shown in FIG. 1. Each contact area (LA) is provided on the side portion A and the side portion B in FIG. 4, and a plurality of contact areas (LA) can be formed thereon.

The buffer layer 120 includes an opening 22 from which a portion of the buffer layer 120 that corresponds to the contact area (LA) is removed, and a plurality of protrusions 600 are formed in the opening 22.

The protrusion 600 includes a first protrusion 62 made of the same material as the buffer layer 120, and a second protrusion 64 provided on the first protrusion and made of the same material as the semiconductor.

In order to increase steps of the protrusion 600, a plurality of buffer layers 120 can be formed. The height (H) of the protrusion 600 can be 3000 Å to 5000 Å in consideration of step coverage of the upper layer. In this instance, the first protrusion 62 is formed to be 3000 Å to 4500 Å thick, and the second protrusion 64 is formed to be 500 Å thick.

A gate insulating layer 140 is formed on the buffer layer 120 and the protrusion 600. The gate insulating layer 140 is formed along the protrusion 600 to form protrusions and depressions.

A gate common voltage line 42 and a gate driving voltage line 52 are formed on the gate insulating layer 140. The gate common voltage line 42 is formed along the protrusions and depressions formed by the protrusion 600 to thus form protrusions and depressions.

The gate common voltage line 42 and the gate driving voltage line 52 are formed on the same layer as the gate line, and they can be made of the same material as the gate line.

The gate common voltage line 42 and the gate driving voltage line 52 respectively receive a common voltage and a driving voltage from a flexible printed circuit (FPC) through pads 4 and 5.

A first interlayer insulating layer 160 is formed on the gate common voltage line 42 and the gate driving voltage line 52.

The first interlayer insulating layer 160 includes common voltage contact holes 83 for exposing the gate common voltage line 42 and driving voltage contact holes 85 for exposing the gate driving voltage line 52.

A data common voltage line 44 connected to the gate common voltage line 42 through the common voltage contact hole 83 and a data driving voltage line 54 connected to the gate driving voltage line 52 through the driving voltage contact hole 85 are formed on the first interlayer insulating layer 160.

The data common voltage line 44 is formed along the protrusions and depressions of the gate common voltage line 42 to thus form protrusions and depressions, and an area that contacts the gate common voltage line 42 is increased by the protrusions and depressions, thereby expecting an effect of reducing contact resistance.

A barrier rib 190 is formed on the data common voltage line 44 and the data driving voltage line 54

The barrier rib 190 has a common voltage opening 97 for exposing the data common voltage line 44. The common voltage opening 97 is provided in the contact area (LA).

A second electrode 730 is formed on the barrier rib 190. The second electrode 730 is connected to the data common voltage line 44 through the common voltage opening 97.

The common voltage applied through the pad 4 is transmitted to the second electrode 730 through a common voltage line 400 configured by the gate common voltage line 42 and the data common voltage line 44.

A contact area of the second electrode 730 with the data common voltage line 44 is increased by the protrusions and depressions of the contact area (LA) formed by the protrusion 600, so the second electrode 730 and the data common voltage line 44 are strongly combined and contact resistance is reduced. Therefore, heat is not generated when an incised portion of the barrier rib 190 configuring the common voltage opening 97 is lifted.

The constant voltage applied through the pad 5 is transmitted to the driving voltage line through a driving voltage line 500 configured by the gate driving voltage line 52 and the data driving voltage line 54.

Figure 8:
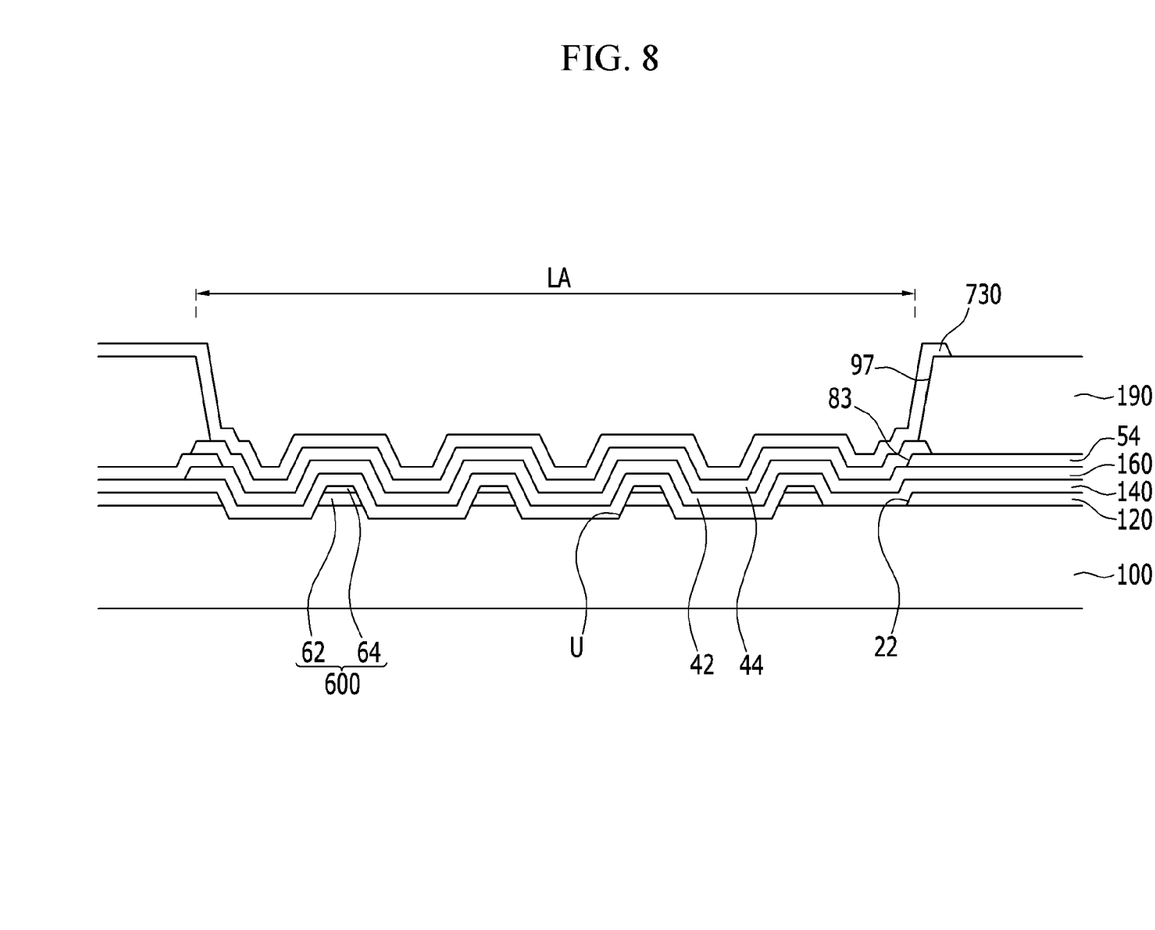
FIG. 8 shows a cross-sectional view of a side portion (B) in a periphery according to another exemplary embodiment.

FIG. 8 shows a cross-sectional view of a side portion (B), shown in FIG. 1, in a periphery according to another exemplary embodiment.

An interlayer configuration is generally equivalent to that of FIG. 3 to FIG. 7 so different parts will be described in detail.

The substrate 100 in the contact area (LA) according to the exemplary embodiment of FIG. 8 has a recess portion (U). The recess portion (U) is provided between adjacent protrusions 600 and it increases the step of the protrusion.

Therefore, when the step caused by the protrusion 600 formed by using the buffer layer and the semiconductor is sufficient, the recess portion (U) may not be formed in the substrate 100.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a pixel unit formed on a substrate, the pixel unit including an organic light emitting diode for displaying an image; and
   a periphery formed on an edge portion of the organic light emitting diode display and surrounding the pixel unit, the periphery comprising:
   a gate common voltage line formed on the substrate and receiving a common voltage from an external circuit,
   an interlayer insulating layer covering the gate common voltage line and including a common voltage contact hole exposing a part of the gate common voltage line,
   a data common voltage line formed on the interlayer insulating layer and contacting the gate common voltage line through the common voltage contact hole,
   a barrier rib for covering the data common voltage line and including a common voltage opening for exposing a part of the data common voltage line,
   a common electrode formed on the barrier rib and contacting the data common voltage line through the common voltage opening, and
   a plurality of protrusions provided in the common voltage contact hole and directly formed on the substrate protruding toward the gate common voltage line.

2. The organic light emitting diode display of claim 1, wherein the organic light emitting diode comprises a first electrode, an organic emission layer provided on the first electrode, and a second electrode provided on the organic emission layer, and the common electrode being integrally formed with the second electrode.

3. The organic light emitting diode display of claim 2, wherein the second electrode is formed on the pixel unit.

4. The organic light emitting diode display of claim 2, wherein the pixel unit includes a thin film transistor for connecting the first electrode to a drain electrode of the thin film transistor.

5. The organic light emitting diode display of claim 4, wherein the protrusion is formed with a material that includes a material of a semiconductor of the thin film transistor.

6. The organic light emitting diode display of claim 5, further comprising a buffer layer formed on the substrate, each of the protrusions including a first protrusion made of the same material as the buffer layer, and a second protrusion provided on the first protrusion and made of the same material as the semiconductor.

7. The organic light emitting diode display of claim 6, wherein the buffer layer includes at least one of silicon nitride and silicon oxide.

8. The organic light emitting diode display of claim 1, further comprising a buffer layer formed on the substrate, the protrusions being made of the same material as the buffer layer.

9. The organic light emitting diode display of claim 8, wherein the buffer layer includes at least one of silicon nitride and silicon oxide.

10. The organic light emitting diode display of claim 1, wherein the substrate includes a recess portion provided between neighboring protrusions.

11. The organic light emitting diode display of claim 1, wherein the pixel unit includes:
    a gate line formed on the substrate and transmitting a scan signal;
    a data line and a driving voltage line crossing the gate line in an insulated manner and transmitting a data signal and a driving voltage, respectively;
    a switching thin film transistor connected to the gate line and the data line;
    a driving thin film transistor connected to the switching thin film transistor and the driving voltage line;
    a first electrode connected to the driving thin film transistor;
    an organic emission layer formed on the first electrode; and
    a second electrode formed on the organic light emitting diode, wherein the gate common voltage line is formed on the same layer as the gate line, and the data common voltage line is formed on the same layer as the data line.

* * * * *